US012246928B2

(12) United States Patent
Aguilar

(10) Patent No.: US 12,246,928 B2
(45) Date of Patent: Mar. 11, 2025

(54) FLUID-OPERATED GRIPPING APPARATUS AND METHOD FOR HOLDING A WORKPIECE IN A WORKING ORIENTATION

(71) Applicant: CORNING INCORPORATED, Corning, NY (US)

(72) Inventor: Alejandro Aguilar, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 739 days.

(21) Appl. No.: 17/417,260

(22) PCT Filed: Dec. 5, 2019

(86) PCT No.: PCT/US2019/064574
§ 371 (c)(1),
(2) Date: Jun. 22, 2021

(87) PCT Pub. No.: WO2020/142158
PCT Pub. Date: Jul. 9, 2020

(65) Prior Publication Data
US 2022/0063931 A1 Mar. 3, 2022

Related U.S. Application Data

(60) Provisional application No. 62/788,437, filed on Jan. 4, 2019.

(51) Int. Cl.
*B25B 1/22* (2006.01)
*B25B 5/16* (2006.01)
(Continued)

(52) U.S. Cl.
CPC ............ *B65G 47/90* (2013.01); *B25B 1/22* (2013.01); *B25B 5/163* (2013.01); *B23B 31/101* (2013.01); *H01L 21/68728* (2013.01)

(58) Field of Classification Search
CPC ............ B23B 2260/004; B23B 31/101; H01L 21/68728; H01L 21/67051; Y10T 279/1208; B25J 9/1612; B65G 47/90
(Continued)

(56) References Cited

U.S. PATENT DOCUMENTS 601,513 A * 3/1898 Hartness ........... B23B 31/16275
279/123
2,260,995 A * 10/1941 Kruczek ................... B25B 1/22
403/90

(Continued)

FOREIGN PATENT DOCUMENTS

| AU | 2016247095 A1 | 7/2017 |
| CN | 101954601 A | 1/2011 |

(Continued)

OTHER PUBLICATIONS

Particulate Filters and Ceramic Substrates _ How it Works _ Glass Age _ Corning (Year: 2024).*

(Continued)

*Primary Examiner* — Mahdi H Nejad
(74) *Attorney, Agent, or Firm* — Kevin M. Able

(57) ABSTRACT

A fluid-operated gripping apparatus for holding a workpiece having a curved sidewall in a working orientation, and associated methods for gripping and holding a workpiece, are provided. Three fluid-operated actuators, each including an actuator rod and a moveable piston arranged within a cylinder, are equally spaced around a perimeter of a workpiece and receive fluid from a single pressurized fluid source. A fluid (e.g., hydraulic or pneumatic) circuit causes the actuators to extend during a closing stroke of the gripping apparatus according to the force equalization principle. Each actuator includes an end effector pivotally coupled with an actuator rod and configured to contact a surface of the workpiece at exactly two points. A backstop (Continued)

configured to contact an end face of the workpiece is coupled with a rotational joint.

19 Claims, 9 Drawing Sheets

(51) Int. Cl.
  *B65G 47/90* (2006.01)
  *B23B 31/10* (2006.01)
  *H01L 21/687* (2006.01)
(58) Field of Classification Search
  USPC .................................................. 279/123, 110
  See application file for complete search history.

(56) References Cited

U.S. PATENT DOCUMENTS

| | | | |
|---|---|---|---|
| 3,082,015 | A | 3/1963 | Hohwart et al. |
| 3,655,232 | A | 4/1972 | Martelee |
| 3,815,892 | A * | 6/1974 | Tulk ........................ B25B 1/22 269/75 |
| 4,572,492 | A * | 2/1986 | Kawakita ................ B23Q 1/28 269/75 |
| 4,682,931 | A | 7/1987 | House |
| 6,099,227 | A | 8/2000 | Shellhammer |
| 6,435,496 | B1 * | 8/2002 | Phillips ..................... B25B 5/10 269/94 |
| 6,543,665 | B1 | 4/2003 | Farrell et al. |
| 6,568,694 | B1 | 5/2003 | White |
| 9,403,647 | B2 | 8/2016 | Fahldieck |
| 9,475,126 | B2 * | 10/2016 | Fujiwara ............... B23B 31/101 |
| 2006/0131782 | A1 | 6/2006 | Mudd et al. |
| 2008/0157487 | A1 * | 7/2008 | Hall ...................... B23B 31/101 82/170 |
| 2012/0224983 | A1 * | 9/2012 | Yi ........................ F15B 11/161 251/30.01 |
| 2013/0205957 | A1 * | 8/2013 | Karlein ................... B23B 31/16 82/142 |
| 2015/0308466 | A1 | 10/2015 | Girtman et al. |
| 2017/0018451 | A1 * | 1/2017 | Chen ................. H01L 21/68728 |
| 2019/0285094 | A1 * | 9/2019 | Schaber ............... F15B 11/022 |
| 2023/0161318 | A1 * | 5/2023 | Aguilar ................. B23Q 3/183 700/186 |

FOREIGN PATENT DOCUMENTS

| | | |
|---|---|---|
| CN | 201776477 U | 3/2011 |
| CN | 203003904 U | 6/2013 |
| CN | 103507077 A | 1/2014 |
| CN | 204054072 U | 12/2014 |
| CN | 204322094 U | 5/2015 |
| CN | 105171761 A | 12/2015 |
| CN | 205380689 U | 7/2016 |
| CN | 105883398 A | 8/2016 |
| CN | 205466289 U | 8/2016 |
| CN | 106078787 A | 11/2016 |
| CN | 106457576 A | 2/2017 |
| CN | 106639690 A | 5/2017 |
| CN | 106694955 A | 5/2017 |
| CN | 106770537 A | 5/2017 |
| CN | 206172522 U | 5/2017 |
| CN | 206225455 U | 6/2017 |
| CN | 206238053 U | 6/2017 |
| CN | 206336958 U | 7/2017 |
| DE | 10050428 C1 | 6/2002 |
| JP | 02-121126 U | 10/1990 |
| JP | 07-164237 A | 6/1995 |
| JP | 11-197976 A | 7/1999 |
| JP | 2008-524039 A | 7/2008 |
| JP | 2010-194635 A | 9/2010 |
| JP | 2013-136125 A | 7/2013 |

OTHER PUBLICATIONS

How it Works: Corning's Innovative Emissions-Control Solutions; found at: https://www.youtube.com/watch?v=VDQO3nHKHVM&t=86s (Year: 2020).*
Corning's Extrusion Manufacturing Process; found at: https://www.youtube.com/watch?v=Oql0eOubnmY (Year: 2017).*
Corning DuraTrap® GC gasoline particulate filter (foreground) and a Corning FLORA® low-mass substrate for catalytic converters (pdf) (Year: 2020).*
Substrates_and_Filters_CET_Infographic (Corning) (Year: 2024).*
Machinedesign_9779_hydraulicsymbols (carlos gonzalez) (Year: 2024).*
Hydraulic Circuits; Retrieved from: https://app.knovel.com/hotlink/pdf/id:kt00C5U0E4/practical-hydraulic-systems/symbols-hydraulic-components (Year: 2005).*
Chinese Patent Application No. 201980087934.4, Office Action dated May 26, 2022, 5 pages (English Translation Only), Chinese Patent Office.
Bizys et al., "Robotic Grippers with Accuracy Centering Fingers", Solid State Phenomena vol. 113, 2006, pp. 307-312.
Ganatsios et al., "CAD analysis applied to self-centering compliant grippers", Applied Mechanics and Materials, vol. 327, 2013, pp. 305-309.
Hesselbach et al., "Centering electrostatic microgripper and magazines for microassembly tasks", Proceedings of SPIE—The International Society for Optical Engineering, vol. 4568, 2001, pp. 270-277.
International Search Report and Written Opinion of the International Searching Authority; PCT/US2019/064574; dated Feb. 18, 2020; 9 pages; European Patent Office.
Kerak et al., "Automatic gripper exchange in intelligent manufacturing systems"—Annals of DAAAM and Proceedings of the International DAAAM Symposium, 2011, pp. 1313-1314.
Simionescu et al., "Optimum design of self centering grippers", UPB Scientific Bulletin, Series D: Mechanical Engineering, vol. 73, No. 1, 2011, pp. 43-52.
Torralba et al., "A three-fingered, touch-sensitive, metrological micro-robotic assembly tool", Measurement Science and Technology (2015), vol. 26, No. 12, 2015, 21 pages.
Xu et al., "Analysis of a novel lifting mechanism for forging manipulators", Proceedings of the Institution of Mechanical Engineers, Part C: Journal of Mechanical Engineering, 2014, 10 pages.
Japanese Patent Application No. 2021-538979, Office Action dated Aug. 3, 2022, 15 pages (7 pages of English Translation and 8 pages of Original Document), Japanese Patent Office.

* cited by examiner

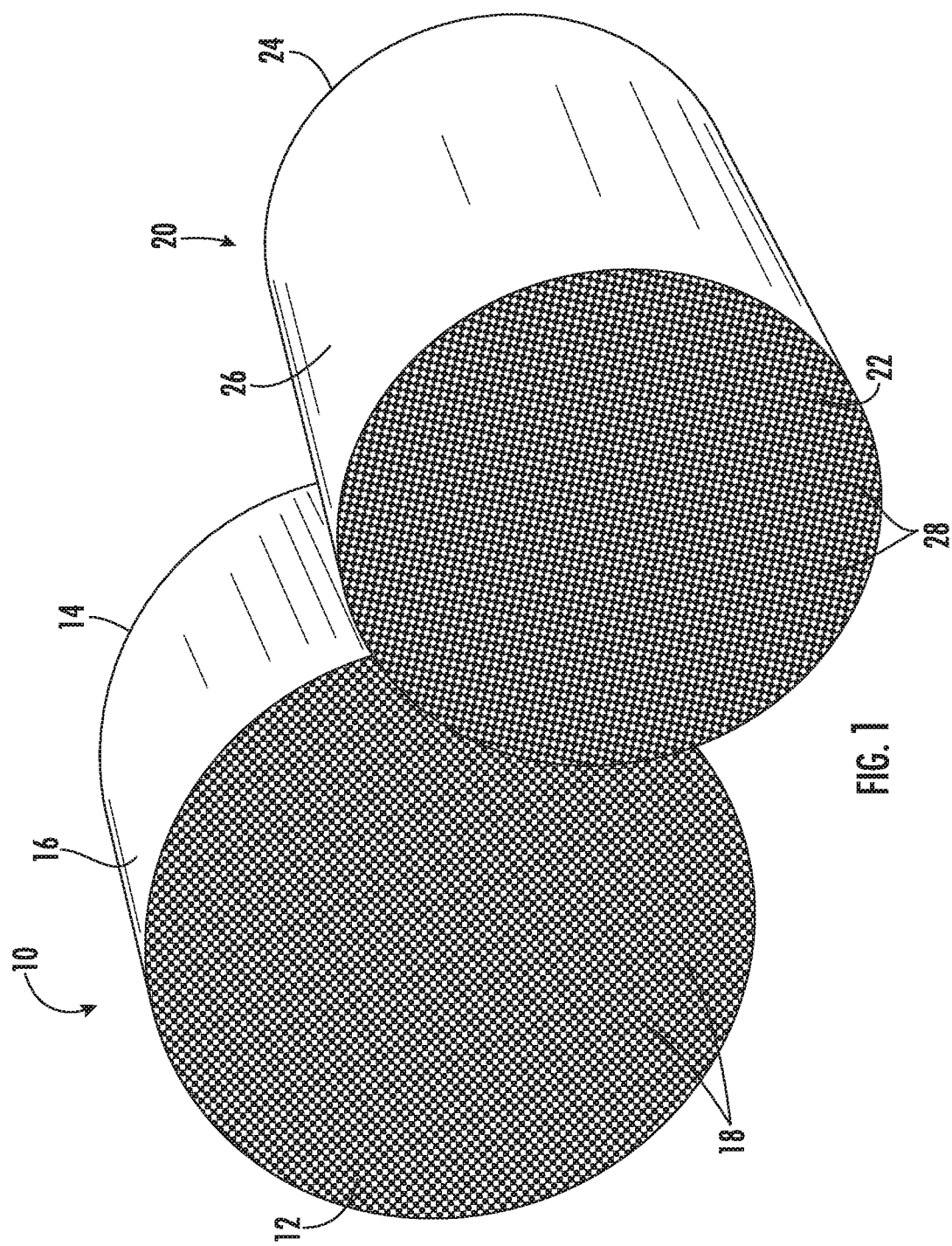

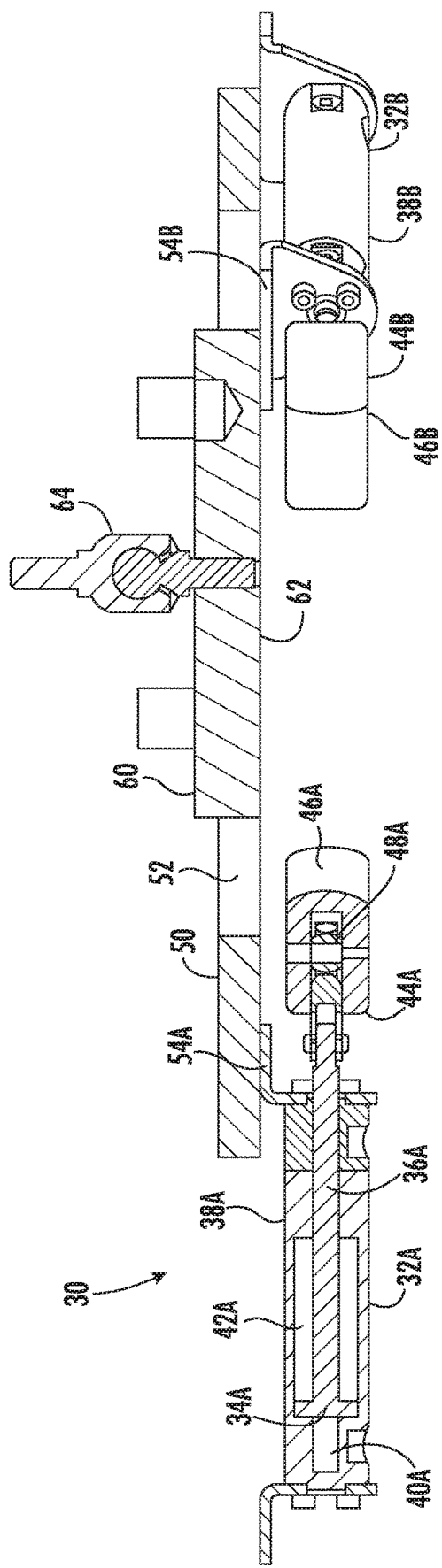

FLUID-OPERATED GRIPPING APPARATUS AND METHOD FOR HOLDING A WORKPIECE IN A WORKING ORIENTATION

This is a national stage application under 35 U.S.C. § 371 of International Application No. PCT/US2019/064574, filed on Dec. 5, 2019, which claims the benefit of priority under 35 U.S.C. § 119 of U.S. Provisional Application No. 62/788,437 filed on Jan. 4, 2019, the content of which is incorporated herein by reference in its entirety.

BACKGROUND

This disclosure relates generally to methods and apparatuses for gripping and holding workpieces, and more particularly to methods and apparatuses for gripping and holding workpieces in a working orientation, such as may be useful for performing one or more operations on a workpiece having curved sidewalls during a manufacturing or processing operation.

Exhaust produced by the combustion of liquid fuels (e.g., diesel or gasoline) can be effectively treated by catalytic converter substrates and/or particulate filters such as wall-flow particulate filters. Particulate filters and substrates for catalyst materials can be advatangeously made of ceramic material which can be porous and light weight and may be provided in the form of a honeycomb structure which may include a plurality of plugs which seal a number of the channels, such as in a particulate filter Representative honeycomb bodies 10, 20 of two different sizes each having a cylindrical shape are shown in FIG. 1. Each honeycomb body 10, 20 has two end faces 12, 14, 22, 24 that are perpendicularly arranged relative to a cylindrical wall 16, 26 extending therebetween. Each end face 12, 14, 22, 24 exposes numerous flow channels 18, 28 extending through an interior of the honeycomb body 10, 20, wherein selective flow channels 18, 28 are subject to being plugged.

Need exists for gripping apparatuses and methods that can accommodate various shaped workpieces, particularly those having thin wall and/or porous wall structures.

SUMMARY

Disclosed herein are a fluid-operated gripping apparatus for holding a workpiece (e.g., such as a honeycomb body) in a working orientation, and associated methods for gripping and holding a workpiece using such an apparatus. Fluid-operated first, second, and third actuators, each comprising an actuator rod coupled with a moveable piston arranged within a cylinder, are equally spaced around a perimeter of a workpiece and configured to be coupled to a single pressurized fluid source. A fluid circuit (e.g., a pneumatic or hydraulic circuit) is provided to cause the actuators to extend (i.e., during a closing stroke of the gripping apparatus) according to the force equalization principle. With the actuators coupled to the same pressurized fluid source, only the actuator experiencing the least resistance to extension will move. Upon contact of one actuator end (e.g., an end effector) with the workpiece, resistance to further movement will increase, and then another actuator will move until its end contacts the workpiece, and the process will continue until all actuators have contacted the workpiece and the pressure is equal in all three actuators. Such process maintains an initial position of the workpiece after the gripping apparatus is actuated. Moreover, each actuator end comprises an end effector pivotally coupled (optionally using a three-degree-of-freedom rotational joint) with an actuator rod and being configured to contact a surface of the workpiece at exactly two points. Such features avoid over-constraining the workpiece, thereby permitting orientation of the workpiece (e.g., relative alignment of an axis of the workpiece such as the relative alignment of an axis of rotation of a cylindrical honeycomb body) to be maintained while gripping is performed. In certain embodiments, over-constraining the workpiece may be further avoided by providing a backstop configured to contact an end face of the workpiece, with the backstop being coupled with a three-degree-of-freedom rotational backstop joint.

In one aspect, the disclosure relates to a gripping apparatus for holding a workpiece in a working orientation. The gripping apparatus comprises fluid-operated first, second, and third actuators that are equally spaced about a perimeter of the workpiece, wherein each actuator comprises an actuator rod coupled with a moveable piston arranged to move within a cylinder having an extend chamber and a retract chamber, and is configured to be coupled to a single pressurized fluid source. The gripping apparatus further comprises a fluid circuit configured to: (i) supply pressurized fluid to the extend chamber of each actuator during a closing stroke of the gripping apparatus, (ii) inhibit backflow of pressurized fluid from the extend chamber of each actuator toward a pressurized fluid source, (iii) maintain a same fluid pressure within the extend chamber of each actuator while the workpiece is held by the gripping apparatus, (iv) release pressurized fluid from the extend chamber of each actuator during an opening stroke of the gripping apparatus, and (v) supply pressurized fluid to the retract chamber of each actuator during the opening stroke of the gripping apparatus. Additionally, the gripping apparatus comprises first, second, and third end effectors pivotally coupled with the actuator rods of the first, second, and third actuators, respectively, wherein each end effector is configured to contact a surface of the workpiece at exactly two points.

In certain embodiments, the workpiece comprises at least one curved sidewall and a first end face, and wherein the gripping apparatus further comprises a backstop configured to contact the first end face, the backstop being coupled with a three-degree-of-freedom rotational backstop joint. In certain embodiments, the three-degree-of-freedom rotational backstop joint may comprise a ball joint.

In certain embodiments, each end effector comprises a forked end portion that defines a first curved surface configured to contact the surface of the workpiece at a first point of the exactly two points, and that defines a second curved surface configured to contact the surface of the workpiece at a second point of the exactly two points. In certain embodiments, an axis of curvature of the first curved surface is arranged 120 degrees apart from an axis of curvature of the second curved surface. In certain embodiments, each end effector comprises a three-degree-of-freedom rotational joint.

In certain embodiments, the fluid circuit comprises: a first check valve configured to inhibit backflow of pressurized fluid from the extend chamber of the first actuator toward the pressurized fluid source; a second check valve configured to inhibit backflow of pressurized fluid from the extend chamber of the second actuator toward the pressurized fluid source; and a third check valve configured to inhibit backflow of pressurized fluid from the extend chamber of the third actuator toward the pressurized fluid source.

In certain embodiments, the fluid circuit comprises: a first bypass valve arranged to permit pressurized fluid to bypass the first check valve and permit flow from the retract chamber of the first actuator toward a pressurized fluid return or toward a fluid vent during the opening stroke of the gripping apparatus; a second bypass valve arranged to permit pressurized fluid to bypass the second check valve and flow from the retract chamber of the second actuator toward a pressurized fluid return or toward a fluid vent during the opening stroke of the gripping apparatus; and a third bypass valve arranged to permit pressurized fluid to bypass the third check valve and flow from the retract chamber of the third actuator a toward pressurized fluid return or toward a fluid vent during the opening stroke of the gripping apparatus. In certain embodiments, the first bypass valve comprises a three port, two position, three-way valve arranged to selectively couple the extend chamber of the first actuator to either (i) the first check valve or (ii) a pressurized fluid return or a fluid vent; the second bypass valve comprises a three port, two position, three-way valve arranged to selectively couple the extend chamber of the second actuator to either (i) the second check valve or (ii) a pressurized fluid return or a fluid vent; and the third bypass valve comprises a three port, two position, three-way valve arranged to selectively couple the extend chamber of the third actuator to either (i) the third check valve or (ii) a pressurized fluid return or a fluid vent.

In certain embodiments, the gripping apparatus further comprises a structural mounting ring, wherein the first, second, and third fluid-operated actuators are mounted to the structural mounting ring, and at least a portion of the backstop is centrally arranged within or proximate to an opening of the structural mounting ring. In certain embodiments, the actuator rod of each actuator is configured to travel in a substantially horizontal plane.

In certain embodiments, the gripping apparatus further comprises an adjustable pressure regulator configured to maintain a selected pressure supplied by the pressurized fluid source to the fluid circuit, whereby adjustment of the selected pressure supplied by the pressurized fluid source is configured to adjust a gripping force exerted by the first, second, and third end effectors on the workpiece.

In certain embodiments, the fluid circuit comprises a hydraulic circuit, and the pressurized fluid comprises a liquid. In certain embodiments, the fluid circuit comprises a pneumatic circuit, and the pressurized fluid comprises a gas (e.g., compressed air). In certain embodiments, the workpiece comprises a substantially cylindrical shape.

In certain embodiments, the fluid circuit comprises a five port, two position, four-way valve arranged between the pressurized fluid source and the first, second, and third actuators.

In another aspect, the disclosure relates to a method for gripping and holding a workpiece in a working orientation utilizing a gripping apparatus comprising fluid-operated first, second, and third actuators that are equally spaced about a perimeter of a workpiece and comprising first, second, and third end effectors coupled with the actuator rods of the first, second, and third actuators, respectively, wherein each actuator comprises (i) a cylinder having an extend chamber and a retract chamber and (ii) an actuator rod coupled with a moveable piston arranged to move within the cylinder. The method comprises supplying pressurized fluid from a single pressurized fluid source to the extend chamber of each of the first, second, and third actuators during a closing stroke of the gripping apparatus, while inhibiting backflow of pressurized fluid from each extend chamber toward the pressurized fluid source, to cause (i) the first end effector to contact a surface of the workpiece only at a first pair of points, (ii) the second end effector to contact the surface of the workpiece only at a second pair of points, and (iii) the third end effector to contact the surface of the workpiece only at a third pair of points. The method further comprises maintaining a same pressure of pressurized fluid within the extend chamber of each actuator while the workpiece is held by the gripping apparatus. The method additionally comprises releasing pressurized fluid from the extend chamber of each actuator during an opening stroke of the gripping apparatus. The method further comprises supplying pressurized fluid to the retract chamber of each actuator during the opening stroke of the gripping apparatus.

In certain embodiments, the method further comprises limiting vertical movement of the workpiece with the backstop configured to contact an end face of the workpiece, wherein the backstop comprises a three-degree-of-freedom rotational backstop joint.

In certain embodiments, the method further comprises lowering at least a portion of the gripping apparatus to establish contact between a pivotally mounted backstop of the gripping apparatus and an upper surface of the workpiece, prior to said supplying of pressurized fluid from the single pressurized fluid source to the extend chamber of each of the first, second, and third actuators.

In certain embodiments, the method further comprises adjusting an output pressure of an adjustable pressure regulator configured to maintain a pressure supplied by the pressurized fluid source to the fluid circuit, whereby adjustment of the selected pressure supplied by the pressurized fluid source serves to adjust a gripping force exerted by the first, second, and third end effectors on the workpiece.

In certain embodiments, the workpiece comprises a substantially cylindrical shape.

In another aspect, any two or more of the foregoing aspects or embodiments or other features disclosed herein may be combined for additional advantage.

Additional features and advantages will be set forth in the detailed description which follows, and in part will be readily apparent to those skilled in the art. It is to be understood that the foregoing general description, the following detailed description, and the accompanying drawings are merely exemplary and intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiment(s), and together with the description serve to explain principles and operation of the various embodiments. Features and attributes associated with any of the embodiments shown or described may be applied to other embodiments shown, described, or appreciated based on this disclosure.

FIG. 1 is a perspective view of two differently-sized honeycomb bodies each comprising a cylindrical honeycomb structure having parallel flow channels extending between end faces thereof.

FIG. 2B is a side cross-sectional view of the gripping apparatus portion of FIG. 2A, taken along section line 2B-2B shown in FIG. 2A.

DETAILED DESCRIPTION

Figure 2A:
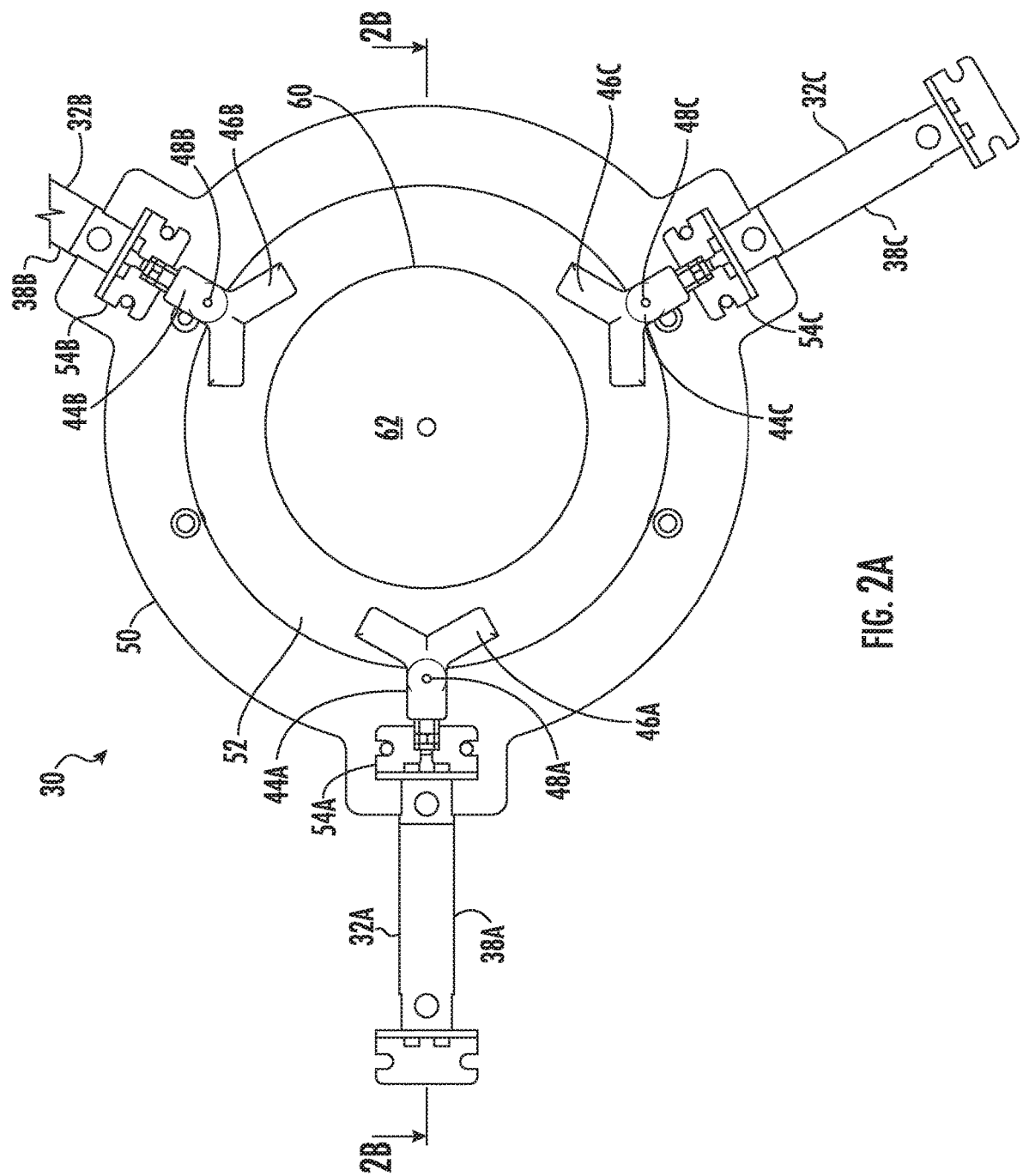
FIG. 2A is a bottom plan view of a portion of a gripping apparatus according to one embodiment of the present disclosure, comprising fluid-operated first, second, and third actuators each having an end effector and configured to receive a cylindrical workpiece therebetween, with a pivotable backstop arranged above the actuators, and a structural mounting ring supporting the actuators.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element or region to another element or region as illustrated in the accompanying drawings. It will be understood that these terms and those discussed above are intended to encompass different orientations of the device in addition to the orientation depicted in the drawings.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Disclosed herein are a fluid-operated gripping apparatus for holding a workpiece (e.g., such as a honeycomb body) in a working orientation, and associated methods for gripping and holding a workpiece using such an apparatus. Fluid-operated first, second, and third actuators, each comprising an actuator rod coupled with a moveable piston arranged within a cylinder, are equally spaced around a perimeter of a workpiece and configured to be coupled to a single pressurized fluid source. A fluid circuit (e.g., a pneumatic or hydraulic circuit) is provided to cause the actuators to extend (i.e., during a closing stroke of the gripping apparatus) according to the force equalization principle. The fluid circuit also serves to cause the actuators to retract (i.e., during an opening stroke of the gripping apparatus). Each actuator may comprise an extend chamber and a retract chamber, and therefore embody a double-acting cylinder. An end of each actuator comprises an end effector having a three-degree-of-freedom rotational joint and being configured to contact a surface of the workpiece at exactly two points (thereby serving as a kinematic contact). This avoids over-constraining the workpiece, thereby permitting orientation of the workpiece (e.g., relative alignment of an axis of the workpiece) to be maintained while gripping is performed. In certain embodiments, over-constraining the workpiece may be further avoided by providing a backstop configured to contact an end face of the workpiece, with the backstop being coupled with a three-degree-of-freedom (3DOF) rotational backstop joint. The gripping apparatus easily accommodates workpieces of various sizes (e.g., diameters) without requiring particular FIGS. 2A and 2B illustrate a portion of a gripping apparatus 30 according to one embodiment, with FIG. 2A providing a bottom plan view and FIG. 2B providing a side cross-sectional view taken along section line 2B-2B shown in FIG. 2A. The gripping apparatus 30 comprises fluid-operated first, second, and third actuators 32A-32C that are arranged 120 degrees apart from one another and supported by (e.g., suspended from) a structural mounting ring 50 using intermediately arranged mounting brackets 54A-54C. As shown, the actuators 32A-32C are arranged in a substantially horizontal plane. Referring to FIG. 2A, each actuator 32A-32C comprises a cylinder 38A-38C and points radially inward toward a center of a circular opening 52 defined by the structural mounting ring 50. Each actuator 32A-32C additionally comprises an end effector 44A-44C having a joint 48A-48C and a forked end portion 46A-46C. In certain embodiments, the joints 48A-48C may embody pivot joints capable of pivotal movement relative to a single plane. In certain embodiments, the joints 48A-48C may embody 3DOF joints (e.g., ball joints) capable of pivotal movement relative to a multiple planes. A backstop 60 having a workpiece receiving surface 62 is centrally arranged within the opening 52 of the structural mounting ring 50. As shown in FIG. 2B, the backstop 60 has an associated three-degree-of-freedom (3DOF) rotational backstop joint 64 to permit pivotal movement in multiple planes relative to an upper support element (not shown). As shown, the 3DOF rotational backstop joint 64 may comprise a ball joint, or may comprise multiple pivotal joints each allowing pivotal movement in a different plane.

With continued reference to FIG. 2B in which internal portions of the first actuator 32A are shown, the first actuator 32A comprises a piston 34A and an actuator rod 36A coupled to the piston 34A, with the piston 34A being configured to move within the cylinder 38A. The cylinder 38A comprises an extend chamber 40A and a retract chamber 42A, thereby embodying a double-acting cylinder. Pressurization of the extend chamber 40A causes the actuator rod 36A to extend outwardly relative to the cylinder 38A, and pressurization of the retract chamber 42A causes the actuator rod 36A to retract into the cylinder 38A. In FIGS. 2A and 2B, each actuator 32A-32C is shown in a retracted positon. With continued reference to FIG. 2B, the extend chamber 40A and the retract chamber 42A may be selectively pressurized with pressurized fluid (e.g., liquid or gas) through a fluid circuit (such as described hereinafter in connection with FIGS. 4A-4C). It is to be appreciated that the second and third actuators 32B, 32C may be identical to the first actuator 32A, thereby comprising elements corresponding to those illustrated and described in connection with the first actuator 32A.

Figure 3:
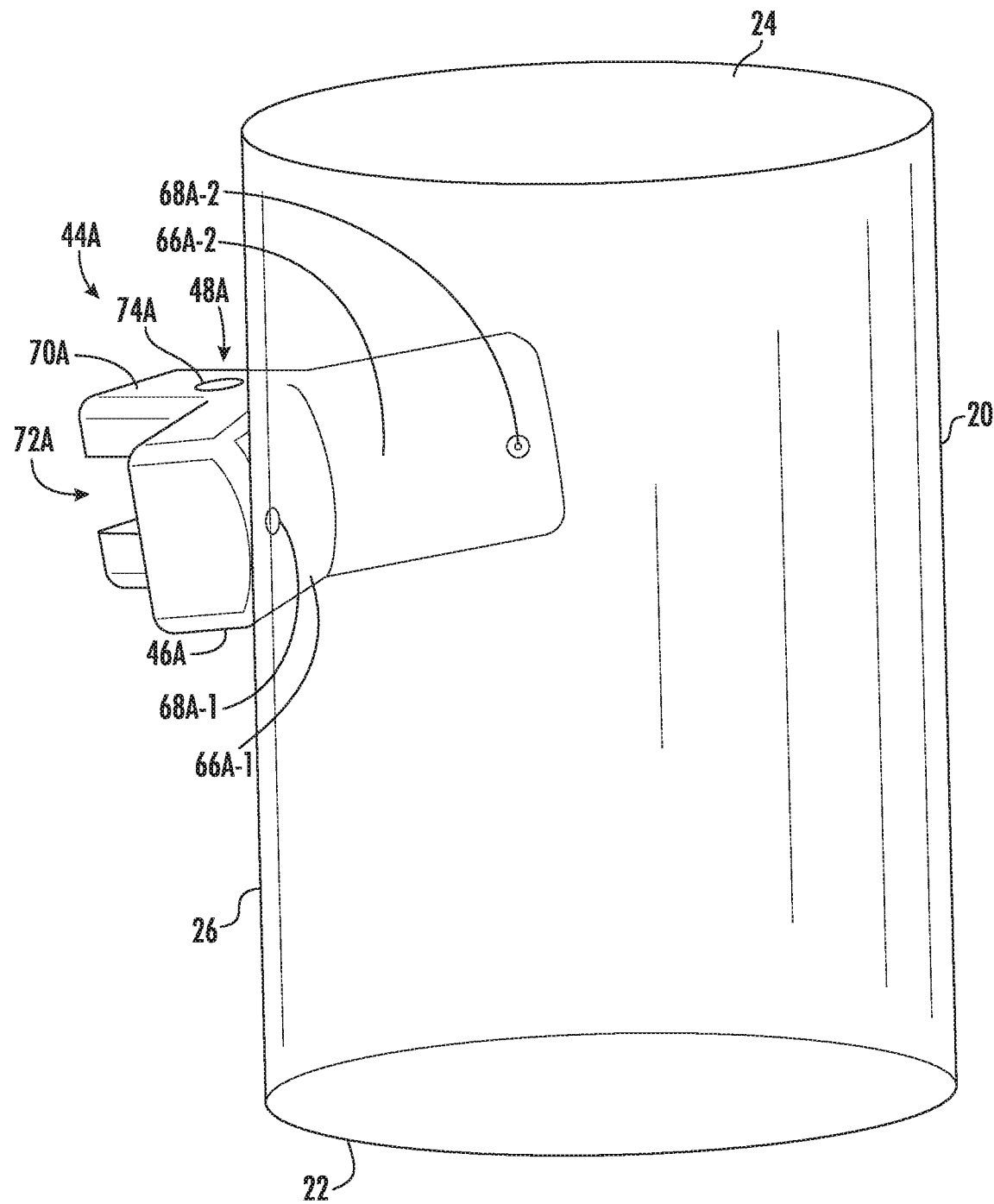
FIG. 3 is a perspective view of an end effector of an actuator shown in FIGS. 2A and 2B arranged in contact with a cylindrical workpiece at two points of contact.

FIG. 3 is a perspective view of an end effector 44A as shown in FIGS. 2A and 2B arranged in contact with a cylindrical workpiece 20 (which may embody a honeycomb body) at two single points of contact 68A-1, 68A-2. The end effector 44A comprises a forked end portion 46A that defines first and second curved contact surfaces 66A-1, 66A-2 each having a convex curvature and configured to contact a cylindrical wall 26 of the cylindrical workpiece 20 (which extends between end faces 22, 24 thereof) at a single contact point 68A-1, 68A-2, such that the end effector 44A as a whole is configured to contact the cylindrical workpiece 20 at exactly two contact points 68A-1, 68A-2. The end effector 44A further comprises an axial body portion 70A defining a central opening 72A through which an actuator rod or rod extension structure (not shown) may be inserted. The axial body portion 70A further comprises a vertical bore 74A that may receive a pin or other structure (not shown) that couples the end effector 44A with a pivotal joint 48A. In certain embodiments, the end effector 44A may be configured to pivot in a single (e.g., horizontal) plane relative to an associated actuator rod (not shown). In certain embodiments, the end effector 44A may be configured to pivot along multiple planes relative to an associated actuator rod, such as by providing a single 3DOF rotational joint (e.g., a ball joint) or multiple sequentially arranged two-degree-of-freedom (2DOF) joints therebetween. By contacting a cylindrical workpiece at exactly two points with each of three end effectors (such as the end effector 44A), and providing end effectors that are pivotally coupled to associated actuator rods, the workpiece is not over-constrained, thereby permitting orientation of the workpiece to be maintained while gripping is performed.

Figure 4A:
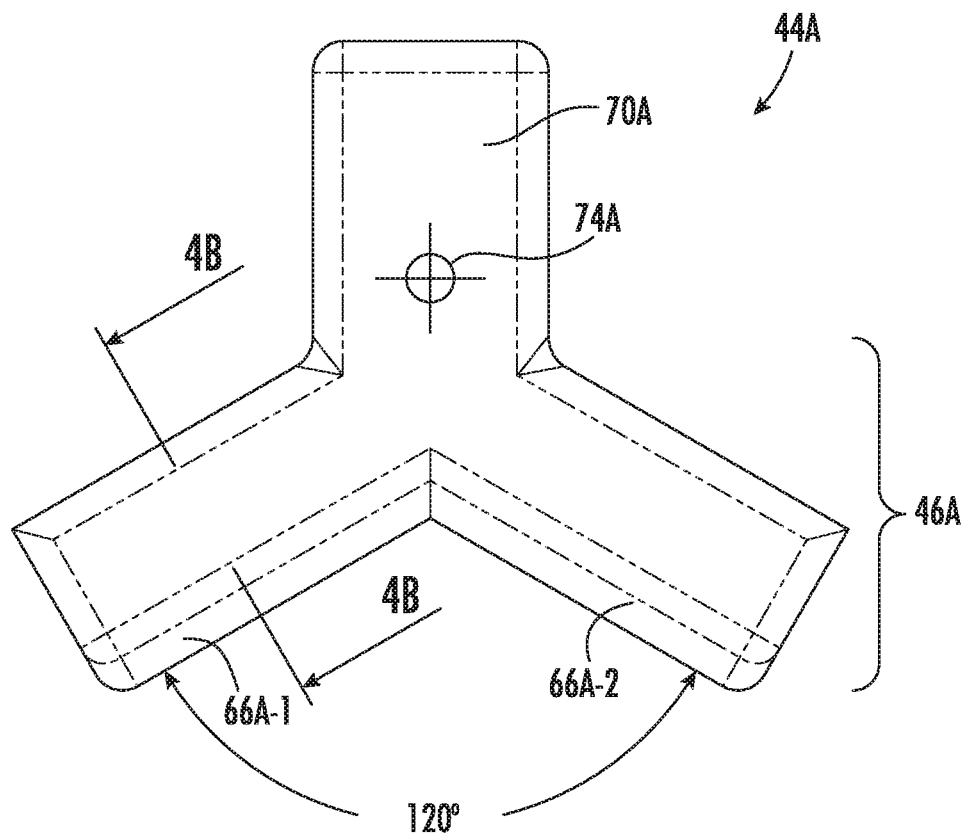
FIG. 4A is a top plan view of an end effector of an actuator as shown in FIGS. 2A, 2B, and 3, with contour lines provided along visible surfaces.
Figure 4B:
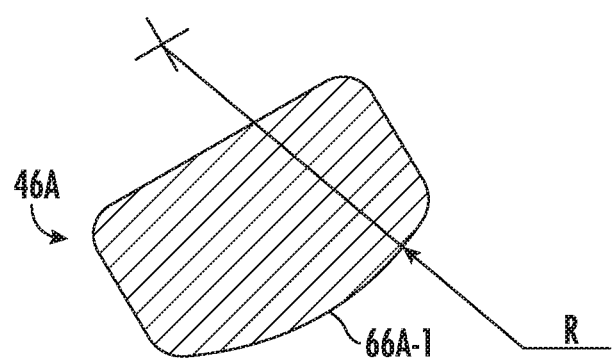
FIG. 4B is a cross-sectional view of a portion of the end effector of FIG. 4A, taken along section line 4B-4B shown in FIG. 4A.

FIG. 4A is a top plan view of an end effector 44A as shown in FIGS. 2A, 2B, and 3, with contour lines provided along visible surfaces. The end effector 44A comprises a forked end portion 46A that defines first and second curved contact surfaces 66A-1, 66A-2 each having a convex curvature. As shown, the first and second curved contact surfaces 66A-1, 66A-2 are arranged 120 degrees apart from one another. The end effector 44A comprises an axial body portion 70A that comprises a vertical bore 74A arranged to receive a pin or other structure (not shown) for coupling the end effector 44A with a pivotal joint (not shown) permitting pivotal movement along one or multiple planes (e.g., as a 2DOF or 3DOF joint) between the end effector 44A and an actuator rod (not shown). FIG. 4B is a cross-sectional view of a segment of the forked end portion 46A of the end effector 44A, taken along section line 4B-4B shown in FIG. 4A, showing curvature of the curved contact surface 66A-1. As shown, a radius of curvature R of the curved contact surface 66A-1 may exceed a body thickness of the forked end portion 46A. In certain embodiments, the end effector may be fabricated of a polymeric material (e.g., polyethylene, polyurethane, ABS, polyimide, silicone, etc.) having coefficient of friction, surface finish, and durometer properties in sufficient ranges to facilitate gripping of a workpiece (e.g., a ceramic honeycomb body, either before or after complete solidification) without conferring damage to sidewall surfaces thereof.

Figure 5A:
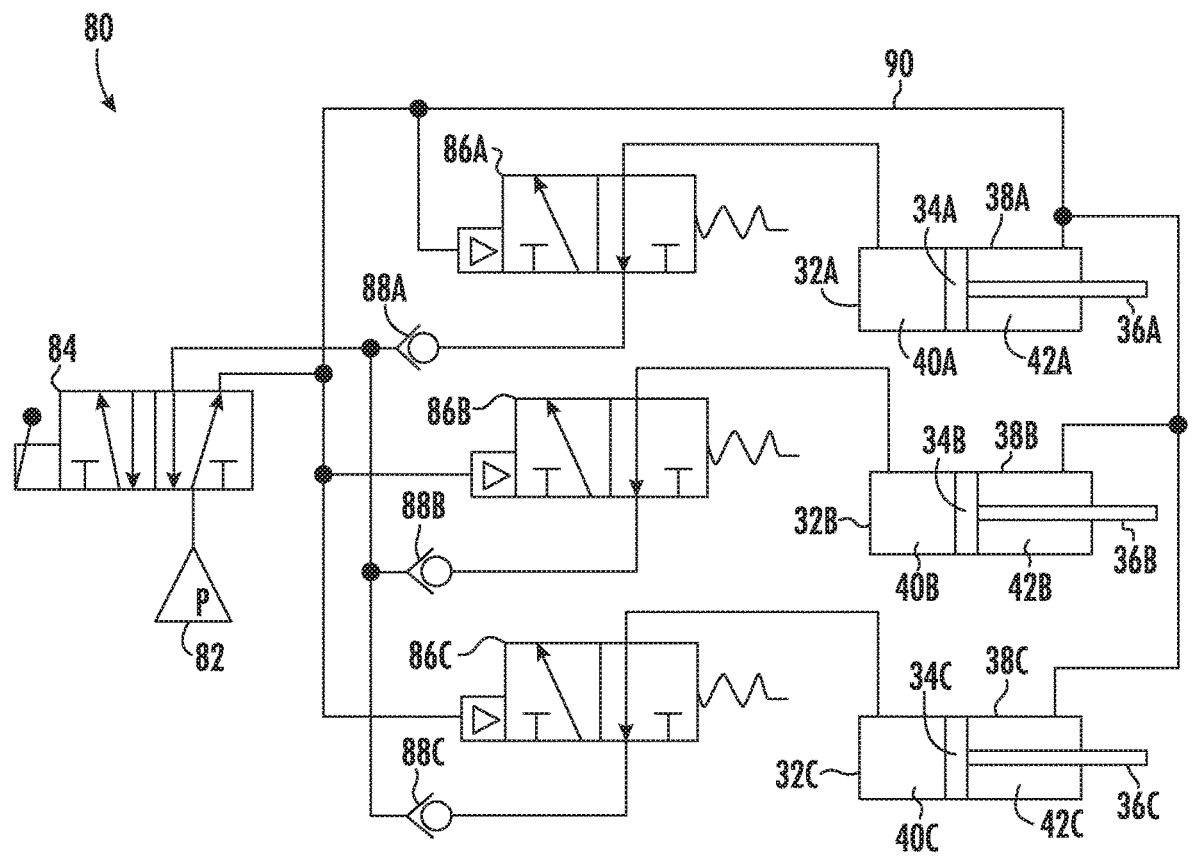
FIG. 5A is a diagram of a fluid circuit showing interconnections between a pressure source, valves, and fluid-operated first through third actuators according to one embodiment of the present disclosure, the fluid circuit being configured to cooperate with actuators and end effectors such as shown in FIGS. 2A-2B as part of a gripping apparatus for holding a workpiece in a working orientation.

FIG. 5A is a diagram of a fluid circuit 80 showing interconnections between a pressurized fluid source 82, valves 84, 86A-88C, 88A-88C, fluid lines 90, and fluid-operated first through third actuators 32A-32C according to one embodiment of the present disclosure, with the fluid circuit 80 being configured to cooperate with components such as shown in FIGS. 2A-2B as part of a gripping apparatus for holding a workpiece in a working orientation. Each actuator 32A-32C comprises a piston 34A-34C with an actuator rod 36A-36C coupled thereto, with the piston 34A being configured to move within a cylinder 38A-38C. Each cylinder 38A-38C embodies a double-acting cylinder, comprising an extend chamber 40A-40C and a retract chamber 42A-42C to permit fluid-controlled movement of the piston 34A-34C for both extension (i.e., during a closing stroke of a gripping apparatus) and retraction (i.e., during an opening stroke of a gripping apparatus) of the piston 34A-34C. A pressure admission valve 84 is coupled with the pressurized fluid source 82, and may be coupled with a vent or drain (not shown). In certain embodiments, the pressure admission valve 84 may comprise a five-port, two-position, four-way valve, although other types and/or combinations of valves may be used in certain embodiments. Downstream of the pressure admission valve 84, first through third actuator-specific valves 86A-86C are provided in parallel, to selectively (i) admit pressurized gas into the extend chamber 40A-40C of each cylinder 38A-38C and (ii) admit pressurized gas into the retract chamber 42A-42C of each cylinder 38A-38C. In certain embodiments, each actuator-specific valve 86A-86C comprises a three-port, two-position, three-way fluid-piloted valve, although other types and/or combinations of valves may be used in further embodiments. The extend chamber 40A-40C of each cylinder 38A-38C has an associated check valve 88A-88C to inhibit flow of pressurized fluid from one cylinder 38A-38C to another cylinder 38A-38C. The check valves 88A-88C enable pressure to equalize during the closing stroke of a gripping apparatus, which in turn allows an end effector (not shown) of every actuator 32A-32C to come into contact with a surface of a workpiece and the same pressure level to be attained in the extend chamber 40A-40C of each cylinder 38A-38C. By disallowing backflow, the check valves 88A-88C ensure that extend chamber pressure is maintained, thereby keeping a workpiece held in position. Since the check valves 88A-88C disallow backflow of pressurized fluid, an alternative path for fluid escape path is provided to permit the actuators 32A-32C to be moved to a retracted position. This is provided with the actuator-specific valves 86A-86C, since when the retract chambers 42A-42C are pressurized, the actuator-specific valves 86A-86C are triggered, permitting pressurized fluid to be exhausted from the retract chambers 42A-42C.

Figure 5B:
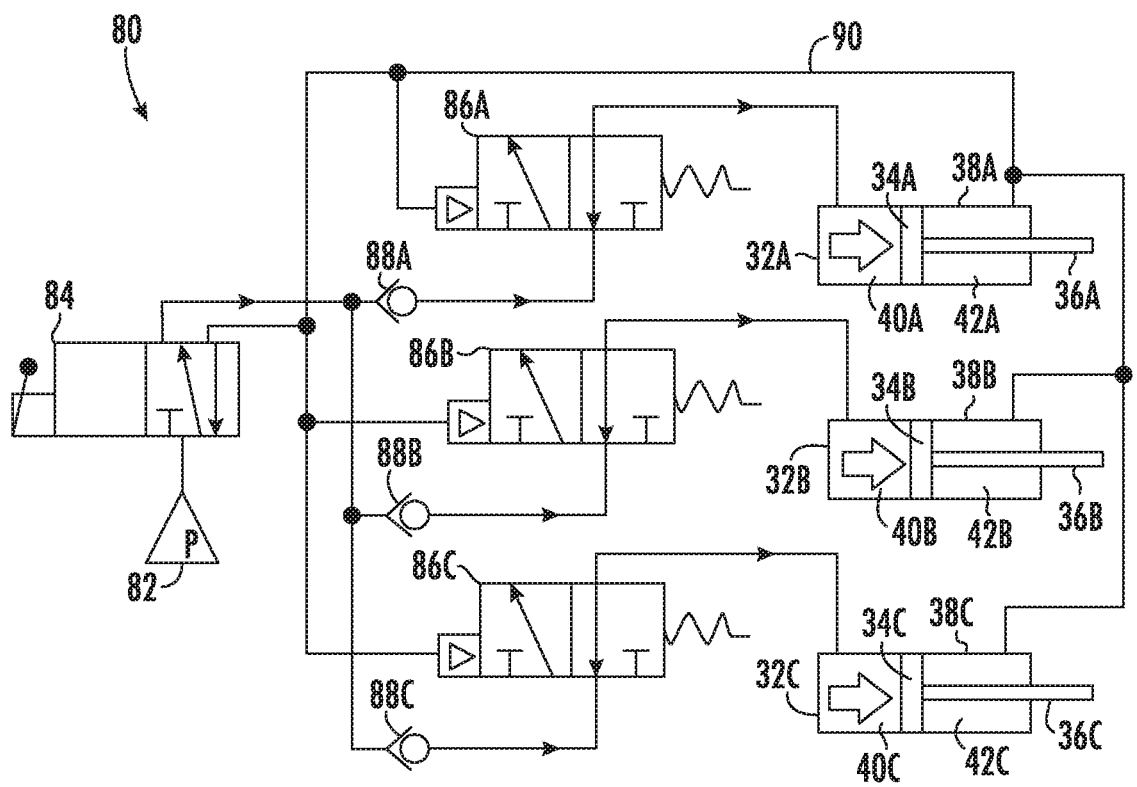
FIG. 5B illustrates the diagram of FIG. 5A during a closing stroke of a gripping apparatus, in which pressurized fluid is supplied from a pressurized fluid source to the extend chamber of each actuator, and backflow of pressurized fluid from the extend chamber of actuator toward the pressurized fluid source is inhibited.
Figure 5C:
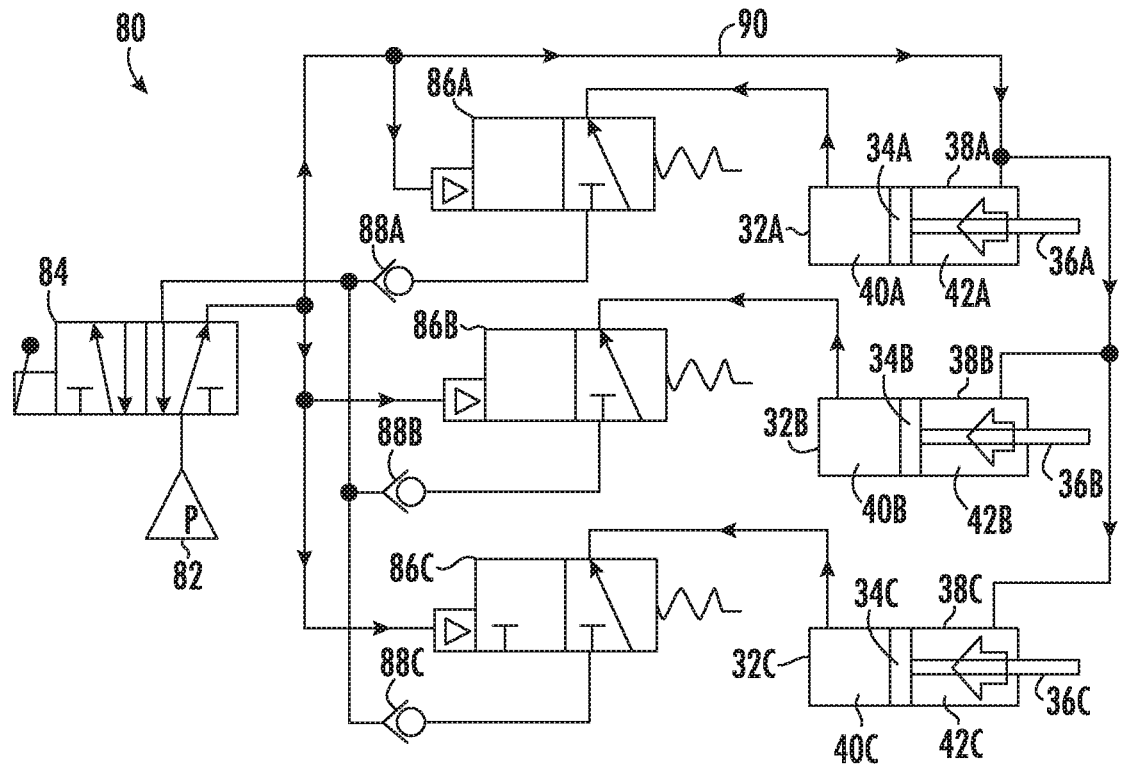
FIG. 5C illustrates the diagram of FIG. 5A during an opening stroke of a gripping apparatus, in which pressurized fluid is released from the extend chamber of each actuator, and pressurized fluid is supplied to a retract chamber of each actuator.

FIGS. 5B and 5C illustrates the fluid circuit 80 of FIG. 5A during a closing stroke and during an opening stroke, respectively, of a gripping apparatus according to one embodiment. Such figures will be described hereinafter, following discussion of preparatory steps that may be employed when a gripping apparatus is used with a plugging apparatus such as a vertical pattie plunger for plugging selected flow channels of a honeycomb body. For example, during fabrication of a honeycomb body, an extruded cylindrical ceramic body comprising a honeycomb structure having internal flow channels may be further processed by a piston-actuated vertical pattie plunger that is used to plug selected flow channels. In such a process, the face alignment of the honeycomb body relative to a piston surface of the vertical pattie plunger helps to allow a more uniform depth of plugs inserted into internal flow channels of the honeycomb body. After plugging material or plugs are inserted into the end face of a honeycomb body, such plugs may be dried in place, optionally aided by heating to high temperatures. Achieving adequate face alignment of a honeycomb body relative to a piston surface of a vertical pattie plunger can be burdensome, as the honeycomb body must be gripped by the cylindrical sidewall (as at least one end face of the honeycomb body must be exposed and is unavailable for gripping), and it is advantageous to maintain the honeycomb body in a working orientation not altered by the gripping process. This gripping task can be further complicated by the need to work with honeycomb bodies of different sizes (e.g., diameters) and/or shapes.

In certain embodiments, a honeycomb body may be positioned on top of a press piston and centered thereon. At least a portion gripping apparatus as described herein may then be lowered until a swivelable (e.g., 3DOF rotatable) backstop of the gripping apparatus contacts a top surface of the honeycomb body and sufficient contact force is exerted therebetween to withstand any backlash and prevent the honeycomb body from slipping. Thereafter, valves of a fluid circuit such as described in FIG. 5A may be operated to cause the honeycomb body to be gripped in position, with actuators extended to cause end effectors to contact a curved sidewall of the honeycomb body.

FIG. 5B illustrates the fluid circuit 80 of FIG. 5A during a closing stroke of a gripping apparatus. As shown, pressurized fluid flows from the pressurized fluid source 82 through the pressure admission valve 84 and check valves 88A-88C to the actuator-specific valves 86A-86C, which are configured to admit the pressurized fluid into the extend chamber 40A-40C of each cylinder 38A-38C. Presence of pressurized fluid in the extend chambers 40A-40C causes the pistons 34A-34C and associated actuator rods 36A-36C to move in a direction from the extend chambers 40A-40C toward the retract chambers 42A-42C (as depicted by the hollow arrows shown in FIG. 5B) into an extended position, according to a closing stroke of the gripping apparatus in which end effectors (not shown) associated with the actuator rods 36A-36C are translated toward an outer surface of a workpiece. With the actuators 32A-32C coupled in parallel to the same pressurized fluid source 82, only the actuator 32A-32C experiencing the least resistance to extension will move, and backflow of pressurized fluid is prevented by the check valves 88A-88C. Upon contact of one actuator end (e.g., an end effector coupled with an actuator rod 36A-36C) with the workpiece, resistance of the actuator to further movement will increase, and then another actuator will move until its end contacts the workpiece, and the process will continue until end effectors of all three actuators 32A-32C have contacted the workpiece and the pressure is equal in the extend chambers 40A-40C of all three actuators 32A-32C. In such a state, equal force is applied by the three actuators 32A-32C to a curved outer surface of the workpiece, and such force as long as fluid pressure is maintained in the extend chambers 40A-40C. Notably, the force exerted by the actuators 32A-32C is directly proportional to the fluid pressure supplied to the extend chambers 40A-40C, such that the exerted force may be adjusted by simply altering a pressure of fluid supplied by the pressurized fluid source 82. In certain embodiments, the pressurized fluid source 82 may comprise an adjustable pressure regulator (not shown) to facilitate adjustment of force exerted by the actuators 32A-32C on a workpiece gripped by a gripping apparatus incorporating the fluid circuit 80.

FIG. 5C illustrates the fluid circuit 80 of FIG. 5A during an opening stroke of a gripping apparatus. The pressure admission valve 84 is moved to a position to supply pressurized fluid to the retract chamber 42A-42C of each cylinder 38A-38C. At the same time, pressurized fluid is supplied to the actuator-specific valves 86A-86C to change the valve position by piloting, thereby permitting pressurized fluid contained in the extend chambers 40A-40C to be exhausted through the actuator-specific valves 86A-86C. By simultaneously pressurizing the retract chambers 42A-42C and depressurizing the extend chambers 40A-40C, each piston 34A-34C is caused to move in a direction from the retract chamber 42A-42C toward the extend chamber 40A-40C, as depicted by the hollow arrows shown in FIG. 5C.

Figure 6:
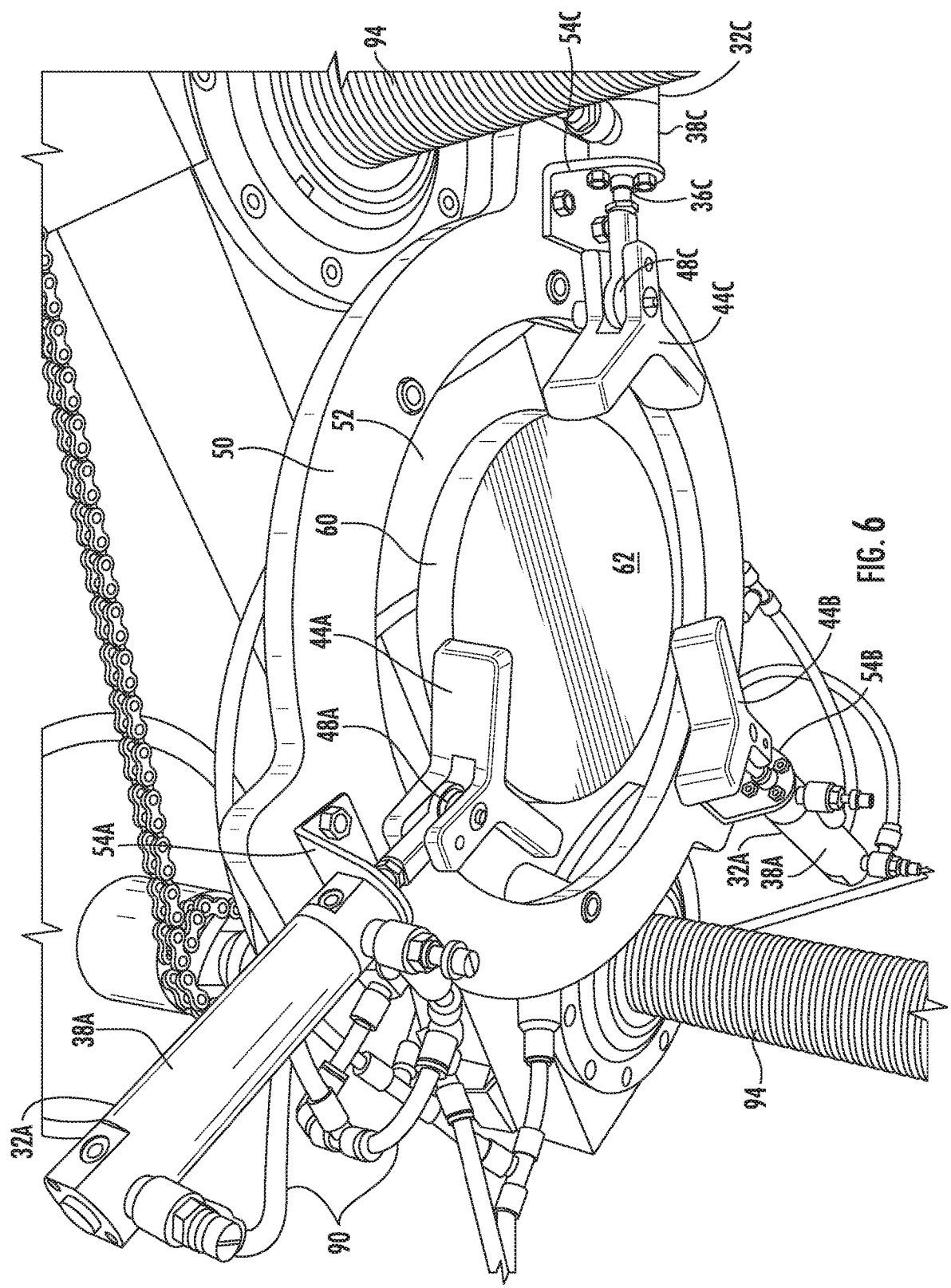
FIG. 6 is a perspective view of at least a portion of a gripping apparatus as shown in FIGS. 2A and 2B, showing the fluid-operated first, second, and third actuators with associated end effectors configured to receive a cylindrical workpiece therebetween, showing a pivotable backstop arranged above the actuators, and showing a structural mounting ring supporting the actuators.

FIG. 6 is a perspective view of at least a portion of a gripping apparatus as shown in FIGS. 2A and 2B, showing the fluid-operated first, second, and third actuators 32A-32C with associated end effectors 44A-44C configured to receive a cylindrical workpiece therebetween, showing a swivelable backstop 60 arranged above the actuators 32A-32C, and showing a structural mounting ring 50 supporting the actuators 32A-32C. The structural mounting ring 50 defines an opening 54, and at least a portion of the backstop 60 (having a workpiece receiving surface 62) is centrally arranged within or proximate to the opening 54. The actuators 32A-32C are arranged to be equally spaced about a perimeter of a workpiece (120 degrees apart from one another) and are supported by (e.g., suspended from) the structural mounting ring 50 with mounting brackets 54A-54C. Each actuator 32A-32C comprises a cylinder 38A-38C that receives fluid lines 90 for supplying pressurized fluid to extend and retract chambers of the cylinder 38A-38C. Each actuator 32A-32C is coupled with an associated end effector 44A-44C via a joint 48A-48C, which may comprise a ball joint in certain embodiments. A support structure for the structural mounting ring 50 may comprise threaded risers 94 that may be caused to rotate to change vertical position of the structural mounting ring 50 (e.g., with a workpiece gripped between end effectors 44A-44C of the actuators 32A-32C), such as may be useful during a GPF plugging process utilizing a vertical pattie plunger (not shown).

Figure 7:
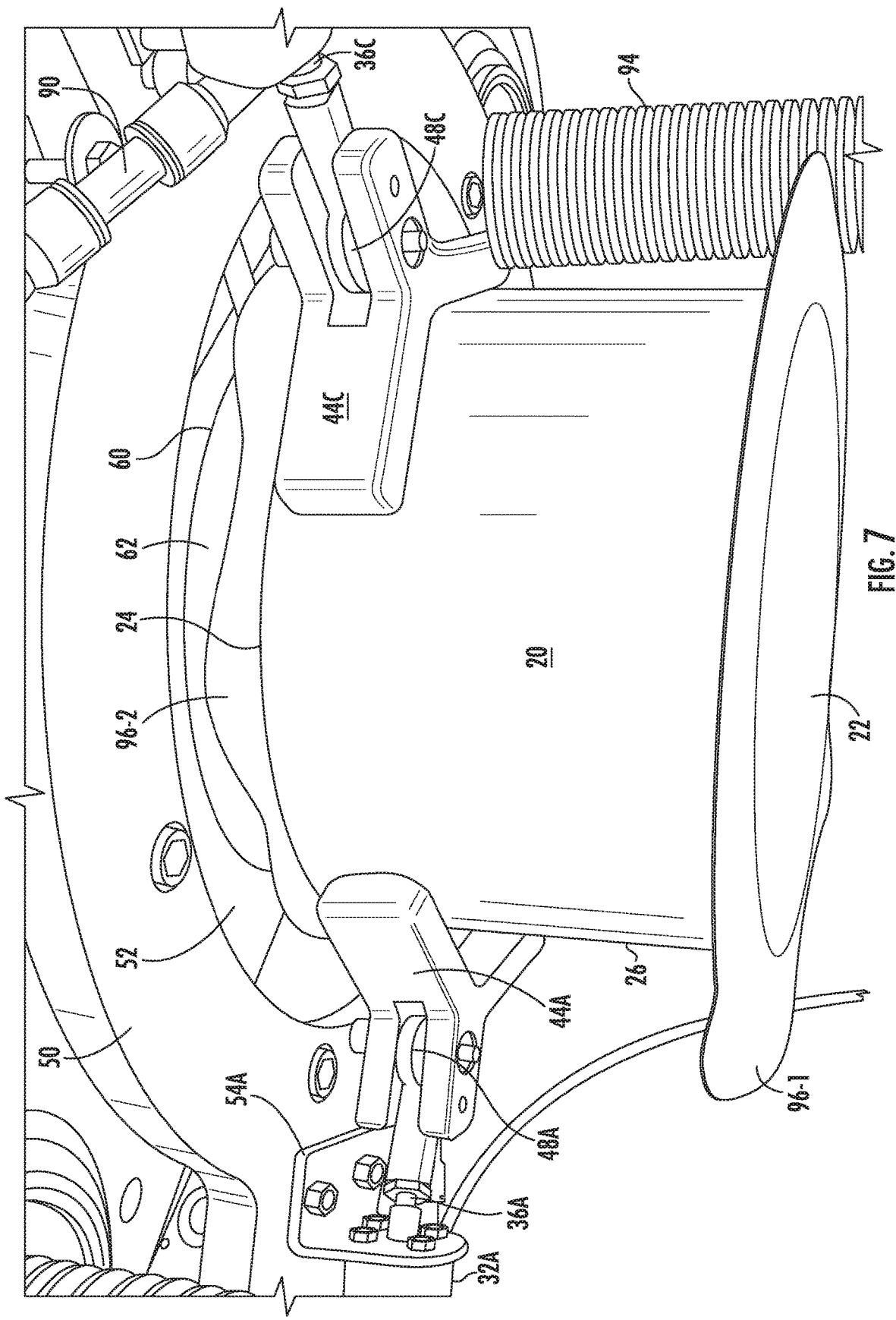
FIG. 7 is a perspective view of a cylindrical workpiece arranged within the gripping apparatus portion of FIG. 6.

FIG. 7 is a perspective view of a cylindrical workpiece (i.e., a honeycomb body) 20 arranged within the gripping apparatus portion of FIG. 6. The honeycomb body 20 comprises a cylindrical wall that extends between opposing end faces 22, 24. As shown, the honeycomb body 20 has removable masks 96-1, 96-2 affixed to the end faces 22, 24. In certain embodiments, the masks 96-1, 96-2 may have multiple holes defined therein and may be used as part of a plugging step by which plugging material is supplied through the holes into selected flow channels of the honeycomb body 20 and pressed into place at a specified depth using a vertical pattie plunger (not shown). As shown, an upper end face 24 of the honeycomb body 20 is arranged against the workpiece receiving surface 62 of the backstop 60 positioned within the opening 52 of the structural mounting ring 50. The honeycomb body 20 is positioned to be gripped laterally by end effectors 44A-44C that are coupled by joints 44A-44C to actuator rods 36A-36C of actuators 32A-32C, which are supported by the structural mounting ring 50 using brackets 54. Fluid lines 90 are provided to supply pressurized fluid to the actuators 32A-32C, and threaded risers 94 are provided to enable vertical position of the structural mounting ring to be adjusted. Operation of the apparatus shown in FIG. 7 proceeds according to steps outlined previously herein.

Although specific embodiments disclosed herein are particularly beneficial for use with workpieces having opposing circular end faces bounding a cylindrical sidewall, it is to be appreciated that gripping apparatuses disclosed herein may be used with workpieces of other shapes, such as: workpieces having one or more curved sidewalls; workpieces having at least one hemispherical or non-planar end face bounding a cylindrical sidewall; workpieces having one or more oval end faces bounding a cylindrical side wall; workpieces having workpieces having substantially polyhedral end faces (e.g., with six, seven, eight, nine, ten, eleven, twelve or more sides, optionally having rounded corners) and sidewalls of the same or similar shape, and the like. Additionally, although specific embodiments disclosed herein relate to use of a gripping apparatus comprising fluid-operated first, second, and third actuators and associated end effectors, it is to be appreciated that additional actuators (e.g., fourth, fifth, sixth, etc.) and associated end effectors may be provided in certain embodiments. In this regard, at least three actuators and associated end effectors may be provided in certain embodiments.

Technical benefits that may be realized by one or more embodiments disclosed herein include: enhanced ability to automatically grip a workpiece having curved (e.g., cylindrical) sidewalls, particularly while maintaining the workpiece in a working orientation; enhanced ability to automatically grip workpieces of different sizes (e.g., diameters) without adjustment; improved ease in adjusting gripping force exerted against sidewalls of workpieces having curved sidewalls; enhanced speed and ease of performing GPF plugging experiments; increased throughput of GPF production; and reduced labor requirements for GPF experimentation and production.

Those skilled in the art will appreciate that other modifications and variations can be made without departing from the spirit or scope of the invention. Since modifications, combinations, sub-combinations, and variations of the disclosed embodiments incorporating the spirit and substance of the invention may occur to persons skilled in the art, the invention should be construed to include everything within the scope of the appended claims and their equivalents.

What is claimed is:

1. A gripping apparatus for holding a workpiece in a working orientation, the gripping apparatus comprising:
    fluid-operated first, second, and third actuators that are equally spaced about a perimeter of the workpiece and supported on a structural mounting ring, wherein each actuator comprises an actuator rod coupled with a moveable piston arranged to move within a cylinder having an extend chamber and a retract chamber, and wherein the fluid-operated first, second, and third actuators are configured to be coupled to a single pressurized fluid source;
    a fluid circuit, comprising the first, second, and third actuators coupled in parallel to the pressurized fluid source, and configured to: (i) supply a pressurized fluid to the extend chamber of each actuator during a closing stroke of the gripping apparatus, (ii) inhibit backflow of the pressurized fluid from the extend chamber of each actuator toward the pressurized fluid source, (iii) maintain a same fluid pressure within the extend chamber of each actuator while the workpiece is held by the gripping apparatus, (iv) release the pressurized fluid from the extend chamber of each actuator during an opening stroke of the gripping apparatus, and (v) supply the pressurized fluid to the retract chamber of each actuator during the opening stroke of the gripping apparatus;
    first, second, and third end effectors pivotally coupled with the actuator rods of the first, second, and third actuators, respectively, wherein each end effector is configured to contact a surface of the workpiece at exactly two points; and
    a backstop configured to contact a first end face of the workpiece, wherein the backstop is coupled to a three-degree-of-freedom rotational backstop joint.

2. The gripping apparatus of claim 1, wherein the three-degree-of-freedom rotational backstop joint comprises a ball joint.

3. The gripping apparatus of claim 1, wherein each end effector comprises a forked end portion that defines a first curved convex surface configured to contact the surface of the workpiece at a first point of the exactly two points, and wherein the forked end portion further defines a second curved convex surface configured to contact the surface of the workpiece at a second point of the exactly two points.

4. The gripping apparatus of claim 3, wherein an axis of curvature of the first curved surface is arranged 120 degrees apart from an axis of curvature of the second curved surface.

5. The gripping apparatus of claim 1, wherein each end effector comprises a three-degree-of-freedom rotational joint.

6. The gripping apparatus of claim 1, wherein the fluid circuit comprises:
    a first check valve configured to inhibit backflow of the pressurized fluid from the extend chamber of the first actuator toward the pressurized fluid source;
    a second check valve configured to inhibit backflow of the pressurized fluid from the extend chamber of the second actuator toward the pressurized fluid source; and
    a third check valve configured to inhibit backflow of the pressurized fluid from the extend chamber of the third actuator toward the pressurized fluid source.

7. The gripping apparatus of claim 6, wherein the fluid circuit further comprises:

a first actuator-specific valve arranged to permit the pressurized fluid to bypass the first check valve and permit flow from the retract chamber of the first actuator toward a pressurized fluid return or toward a fluid vent during the opening stroke of the gripping apparatus;

a second actuator-specific valve arranged to permit the pressurized fluid to bypass the second check valve and flow from the retract chamber of the second actuator toward the pressurized fluid return or toward the fluid vent during the opening stroke of the gripping apparatus; and a third actuator-specific valve arranged to permit the pressurized fluid to bypass the third check valve and flow from the retract chamber of the third actuator toward the pressurized fluid return or toward the fluid vent during the opening stroke of the gripping apparatus.

8. The gripping apparatus of claim 7, wherein:
the first actuator-specific valve comprises a three port, two position, three-way valve arranged to selectively couple the extend chamber of the first actuator to either (i) the first check valve or (ii) the pressurized fluid return or the fluid vent;
the second actuator-specific valve comprises a three port, two position, three-way valve arranged to selectively couple the extend chamber of the second actuator to either (i) the second check valve or (ii) the pressurized fluid return or the fluid vent; and
the third actuator-specific valve comprises a three port, two position, three-way valve arranged to selectively couple the extend chamber of the third actuator to either (i) the third check valve or (ii) the pressurized fluid return or the fluid vent.

9. The gripping apparatus of claim 1, wherein at least a portion of the backstop is centrally arranged within or proximate to an opening of the structural mounting ring.

10. The gripping apparatus of claim 1, wherein the actuator rod of each actuator is configured to travel in a substantially horizontal plane.

11. The gripping apparatus of claim 1, further comprising an adjustable pressure regulator configured to maintain a selected pressure supplied by the pressurized fluid source to the fluid circuit, whereby adjustment of the selected pressure supplied by the pressurized fluid source is configured to adjust a gripping force exerted by the first, second, and third end effectors on the workpiece.

12. The gripping apparatus of claim 1, wherein the pressurized fluid comprises a liquid.

13. The gripping apparatus of claim 1, wherein the pressurized fluid comprises a gas.

14. The gripping apparatus of claim 1, wherein the fluid circuit comprises a five port, two position, four-way valve arranged between the pressurized fluid source and the first, second, and third actuators.

15. The gripping apparatus of claim 1, wherein the workpiece comprises a substantially cylindrical shape.

16. A method for gripping and holding a workpiece in a working orientation utilizing a gripping apparatus comprising fluid-operated first, second, and third actuators that are equally spaced about a perimeter of the workpiece and supported on a structural mounting ring, first, second, and third end effectors coupled with actuator rods of the first, second, and third actuators, respectively, and a backstop configured to contact a first end face of the workpiece, wherein the backstop is coupled to a three-degree-of-freedom rotational backstop joint and each actuator comprises (i) a cylinder having an extend chamber and a retract chamber and (ii) a moveable piston arranged to move within the cylinder, each moveable piston coupled with a corresponding actuator rod of the first, second, and third actuators, the method comprising:
supplying a pressurized fluid from a single pressurized fluid source to the extend chamber of each of the first, second, and third actuators during a closing stroke of the gripping apparatus, the first, second, and third actuators being coupled in parallel to the pressurized fluid source, while inhibiting backflow of the pressurized fluid from each extend chamber toward the pressurized fluid source, to cause (i) the first end effector to contact a surface of the workpiece only at a first pair of points, (ii) the second end effector to contact the surface of the workpiece only at a second pair of points, and (iii) the third end effector to contact the surface of the workpiece only at a third pair of points;
maintaining a same pressure of the pressurized fluid within the extend chamber of each actuator while the workpiece is held by the gripping apparatus;
releasing the pressurized fluid from the extend chamber of each actuator during an opening stroke of the gripping apparatus; and
supplying the pressurized fluid to the retract chamber of each actuator during the opening stroke of the gripping apparatus.

17. The method of claim 16, further comprising limiting vertical movement of the workpiece with the backstop.

18. The method of claim 16, further comprising lowering at least a portion of the gripping apparatus to establish contact between a pivotally mounted backstop of the gripping apparatus and an upper surface of the workpiece prior to said supplying of the pressurized fluid from the single pressurized fluid source to the extend chamber of each of the first, second, and third actuators.

19. The method of claim 16, further comprising adjusting an output pressure of an adjustable pressure regulator configured to maintain a pressure supplied by the pressurized fluid source to the fluid circuit, whereby adjustment of the selected pressure supplied by the pressurized fluid source serves to adjust a gripping force exerted by the first, second, and third end effectors on the workpiece.

* * * * *